(12) United States Patent
Hsieh et al.

(10) Patent No.: US 11,018,021 B2
(45) Date of Patent: *May 25, 2021

(54) CURING PHOTO RESIST FOR IMPROVING ETCHING SELECTIVITY

(71) Applicant: Taiwan Semiconductor Manufacturing Company, Ltd., Hsinchu (TW)

(72) Inventors: Wen-Kuo Hsieh, Taipei (TW); Tsung-Hung Chu, Bade (TW); Ming-Chung Liang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/505,193

(22) Filed: Jul. 8, 2019

(65) Prior Publication Data

US 2019/0333777 A1    Oct. 31, 2019

Related U.S. Application Data

(60) Continuation of application No. 15/089,904, filed on Apr. 4, 2016, now Pat. No. 10,347,505, which is a division of application No. 14/134,526, filed on Dec. 19, 2013, now Pat. No. 9,305,839.

(51) Int. Cl.
| | |
|---|---|
| *H01L 21/311* | (2006.01) |
| *H01L 21/768* | (2006.01) |
| *H01L 21/027* | (2006.01) |
| *G03F 7/40* | (2006.01) |

(52) U.S. Cl.
CPC ........ *H01L 21/31144* (2013.01); *G03F 7/40* (2013.01); *H01L 21/0273* (2013.01); *H01L 21/0277* (2013.01); *H01L 21/31116* (2013.01); *H01L 21/76802* (2013.01); *H01L 21/76811* (2013.01); *H01L 21/76813* (2013.01); *H01L 21/76877* (2013.01)

(58) Field of Classification Search
CPC ............ H01L 21/0273; H01L 21/0277; H01L 21/31116; H01L 21/31144; H01L 21/76802; H01L 21/76811; H01L 21/76813; H01L 21/76877; G03F 7/40
USPC ......................................................... 438/702
See application file for complete search history.

(56) References Cited

U.S. PATENT DOCUMENTS

| | | |
|---|---|---|
| 5,660,682 A | 8/1997 | Zhao et al. |
| 2003/0022487 A1 | 1/2003 | Yoon et al. |
| 2003/0119305 A1* | 6/2003 | Huang ............. H01L 21/76811 438/633 |
| 2004/0150012 A1* | 8/2004 | Jin ..................... H01L 21/02126 257/255 |
| 2005/0089283 A1 | 4/2005 | Michael et al. |
| 2006/0219754 A1* | 10/2006 | Clauberg ................. B08B 7/00 228/4.5 |
| 2008/0038926 A1 | 2/2008 | Ventzek et al. |
| 2008/0153311 A1* | 6/2008 | Padhi ................... C23C 16/045 438/780 |

(Continued)

*Primary Examiner* — Duy T Nguyen
(74) *Attorney, Agent, or Firm* — Slater Matsil, LLP

(57) ABSTRACT

A method includes exposing and developing a negative photo resist, and performing a treatment on the negative photo resist using an electron beam. After the treatment, a layer underlying the photo resist is etched using the negative photo resist as an etching mask.

20 Claims, 10 Drawing Sheets

(56) References Cited

U.S. PATENT DOCUMENTS

| | | | |
|---|---|---|---|
| 2008/0160446 A1 | 7/2008 | Meagley | |
| 2009/0108486 A1* | 4/2009 | Babin | H01L 21/67103 |
| | | | 264/82 |
| 2009/0325080 A1* | 12/2009 | Tarng | G03F 7/095 |
| | | | 430/5 |
| 2010/0210114 A1* | 8/2010 | Ooya | H01J 37/32027 |
| | | | 438/729 |
| 2011/0130008 A1* | 6/2011 | Hsieh | H01L 21/0274 |
| | | | 438/735 |
| 2011/0294072 A1 | 12/2011 | Park et al. | |
| 2011/0300712 A1* | 12/2011 | Kim | H01L 21/0273 |
| | | | 438/703 |
| 2012/0088369 A1* | 4/2012 | Weidman | G03F 7/0752 |
| | | | 438/703 |
| 2013/0295772 A1 | 11/2013 | Kim et al. | |
| 2015/0056816 A1* | 2/2015 | Sato | H01L 21/31144 |
| | | | 438/717 |
| 2015/0179511 A1 | 6/2015 | Hsieh et al. | |

\* cited by examiner

CURING PHOTO RESIST FOR IMPROVING ETCHING SELECTIVITY

PRIORITY CLAIM AND CROSS-REFERENCE

This application is a continuation of U.S. patent application Ser. No. 15/089,904, entitled "Curing Photo Resist for Improving Etching Selectivity," filed on Apr. 4, 2016, now Pat. No. 10,347,505 issued Jul. 9, 2019, which is a divisional of U.S. patent application Ser. No. 14/134,526, entitled "Curing Photo Resist for Improving Etching Selectivity," filed on Dec. 19, 2013, now Pat. No. 9,305,839 issued Apr. 5, 2016, which applications are incorporated herein by reference.

BACKGROUND

Integrated circuit devices such as transistors are formed over semiconductor wafers. The devices are interconnected through metal lines and vias to form functional circuits. The metal lines and vias are formed in back-end-of-line processes. To reduce the parasitic capacitance of the metal lines and vias, the metal lines and vias are formed in low-k dielectric layers, which typically have dielectric constants (k values) lower than 3.8, lower than 3.0, or lower than 2.5.

In the formation of the metal lines and vias, a low-k dielectric layer is etched to form trenches and via openings. The etching of the low-k dielectric material may involve forming a hard mask over the low-k dielectric material, and using the patterned hard mask as an etching mask to form trenches in the low-k dielectric material. Via openings are also formed and aligned to the trenches. The trenches and the via openings are then filled with a metallic material, which may comprise copper. A Chemical Mechanical Polish (CMP) is then performed to remove excess portions of the metallic material over the low-k dielectric material.

In the trench-first approach in the formation of the trenches and via openings, the patterns of the trenches are first defined in a hard mask layer, which is formed over a low-k dielectric layer. Via openings are then formed in the low-k dielectric layer. The vias openings stop at an intermediate level of the low-k dielectric layer. Next, the low-k dielectric layer is etched using the patterned hard mask layer as an etching mask, so that trenches and via openings extend down simultaneously, until the via openings reach the bottom of the low-k dielectric layer. At this time, the bottoms of the trenches are at an intermediate level between the top surface and the bottom surface of the low-k dielectric layer. The trenches and the via openings are then filled with a conductive material to form metal lines and vias, respectively.

The etching of the low-k dielectric layer to form the vias often use a tri-layer etching mask, which includes a bottom layer, a middle layer over the bottom layer, and a photo resist over the middle layer. The photo resist is etched to act as an etching mask of the middle layer. The patterned middle layer is then used as an etching mask to etch the bottom layer. The patterned bottom layer is used as an etching mask to etching the low-k dielectric layer to form the via openings.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method of forming metal lines and vias using a trench-first scheme is provided in accordance with various embodiments. The intermediate stages of forming the metal lines and vias are illustrated in accordance with some exemplary embodiments. The variations of the embodiments are discussed. Throughout the various views and illustrative embodiments, like reference numbers are used to designate like elements.

Figure 1:
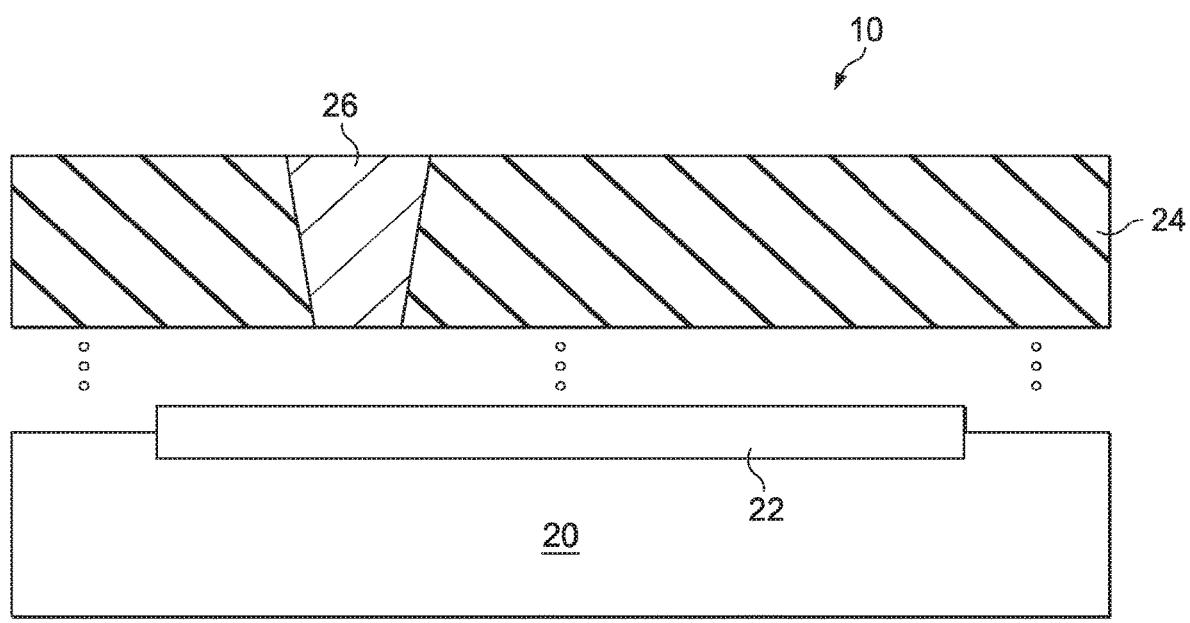
FIGS. 1 through 10 are cross-sectional views of intermediate stages in the formation of metal lines and a via in a low-k dielectric layer in accordance with some exemplary embodiments.

Referring to FIG. 1, wafer 10, which includes substrate 20 and overlying layers, is provided. Substrate 20 may be formed of a semiconductor material such as silicon, silicon germanium, a III-V compound semiconductor, or the like. Substrate 20 may be a bulk substrate or a Semiconductor-On-Insulator (SOI) substrate. Integrated circuit devices 22, which may include active devices such as transistors, are formed at a surface of substrate 20.

Dielectric layer 24 is formed over substrate 20. In some embodiments, dielectric layer 24 is an Inter-Metal Dielectric (IMD), which is a low-k dielectric layer having a dielectric constant (k value) lower than about 3.0, or lower than about 2.5 in some exemplary embodiments. Dielectric layer 24 may include a porous low-k dielectric material such as porous oxygen-doped silicon carbide (SiOC).

Metal feature 26 is formed in dielectric layer 24. In some embodiments, metal feature 26 is a metal line, which may be formed of copper or a copper alloy. In alternative embodiments, metal feature 26 includes other conductive materials such as tungsten, aluminum, or the like. Furthermore, metal feature 26 may also include a conductive diffusion barrier layer (not shown) formed underlying and encircling the copper or copper alloy. The conductive diffusion barrier layer may be formed of titanium, titanium nitride, tantalum, tantalum nitride, or the like.

Figure 2:
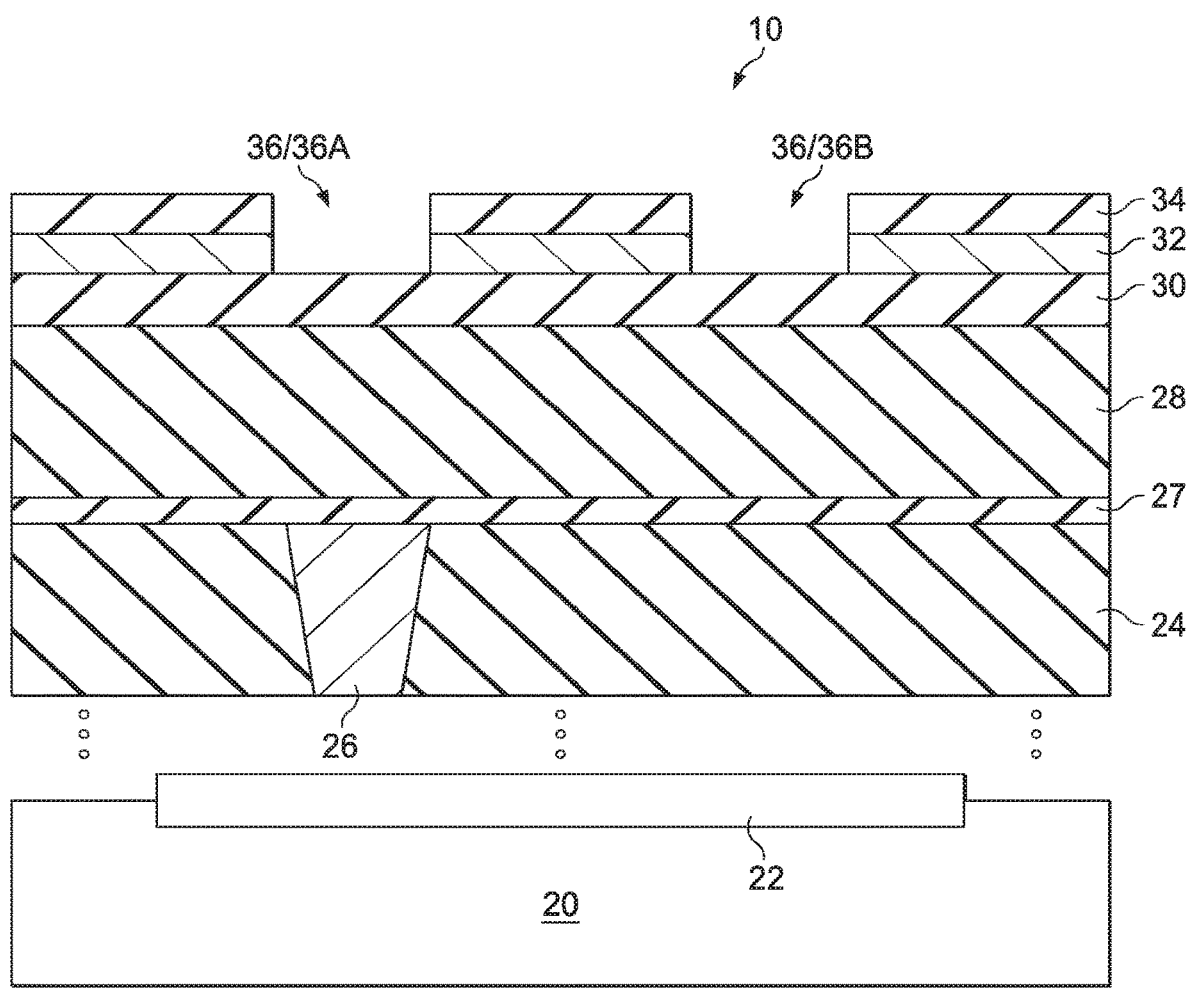

Referring to FIG. 2, etch stop layer 27 is formed over dielectric layer 24. Etch stop layer 27 may comprise a dielectric material such as silicon carbide, silicon nitride, or the like. Dielectric layer 28 is further formed over etch stop layer 27. Dielectric layer 28 may be an IMD layer, which is formed of a dielectric material having a dielectric constant (k value) lower than 3.8, lower than about 3.0, or lower than about 2.5, for example.

Over low-k dielectric layer 28 resides dielectric hard mask 30, which may be formed of silicon oxide (such as tetraethylorthosilicate (TEOS) oxide), Nitrogen-Free Anti-Reflective Coating (NFARC, which is an oxide), silicon carbide, silicon oxynitride, or the like. Dielectric hard mask 30 may also act as an Anti-Reflective Coating (ARC) in the patterning of the overlying metal hard mask 32 and dielectric hard mask layer 34 in some embodiments. The formation methods include Plasma Enhance Chemical Vapor Deposition (PECVD), High-Density Plasma (HDP) deposition, or the like.

Metal hard mask 32 is formed over dielectric hard mask 30. In some embodiments, metal hard mask 32 comprises titanium nitride, titanium, tantalum nitride, tantalum, or the like. The formation methods include Physical Vapor Deposition (PVD), Radio Frequency PVD (RFPVD), Atomic Layer Deposition (ALD), or the like.

Dielectric hard mask layer 34 is formed over metal hard mask 32. Dielectric hard mask layer 34 may be formed of a material selected from the same candidate materials of dielectric hard mask layer 30, and may be formed using a method that is selected from the same group of candidate methods for forming dielectric hard mask layer 30. Dielectric hard masks 30 and 34 may be formed of the same material, or may comprise different materials.

Dielectric hard mask layer 34 and metal hard mask 32 are patterned to form trenches 36 (including 36A and 36B). Trenches 36 are formed by forming a patterned photo resist (not shown), and using the patterned photo resist to etch dielectric hard mask layer 34 and metal hard mask 32. The photo resist is then removed.

Figure 3:
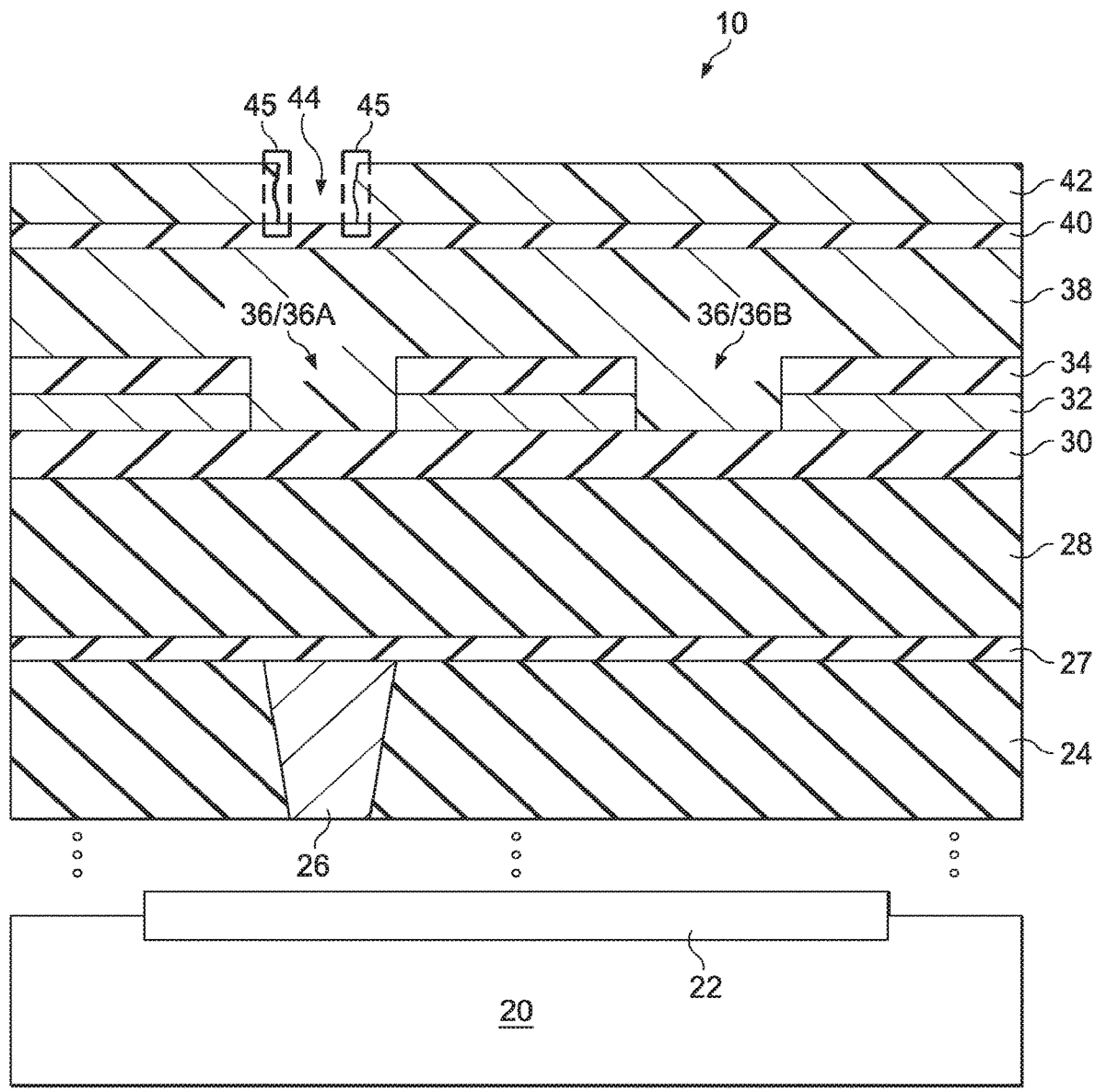

Next, referring to FIG. 3, a tri-layer is formed over dielectric hard mask layer 34. The tri-layer includes under layer (sometimes referred to as a bottom layer) 38, middle layer 40 over under layer 38, and upper layer 42 over middle layer 40. In some embodiments, under layer 38 and upper layer 42 are formed of photo resists, which comprise organic materials. Accordingly, in subsequent description, upper layer 42 is referred to as photo resist 42. Middle layer 40 may comprise an inorganic material, which may be a nitride (such as silicon nitride), an oxynitride (such as silicon oxynitride), an oxide (such as silicon oxide), or the like. Middle layer 40 has a high etching selectivity with relative to photo resist 42 and under layer 38, and hence photo resist 42 is used as an etching mask for the patterning of middle layer 40, and middle layer 40 is used as an etching mask for the patterning of bottom layer 38.

After the coating of photo resist 42, photo resist 42 is patterned to form opening 44. The patterning of photo resist 42 includes a light-exposure and a development step. In some embodiments, photo resist 42 is a negative photo resist, so that the parts of photo resist 42 exposed to light remain after the light exposure and development, while the parts of photo resist 42 not exposed to light are removed. Opening 44 overlaps trench 36A. FIG. 3 illustrates that some residues 45 (which may be by-product polymers) of photo resist 42 are left in opening 44, which residues 45 need to be removed.

Figure 4:
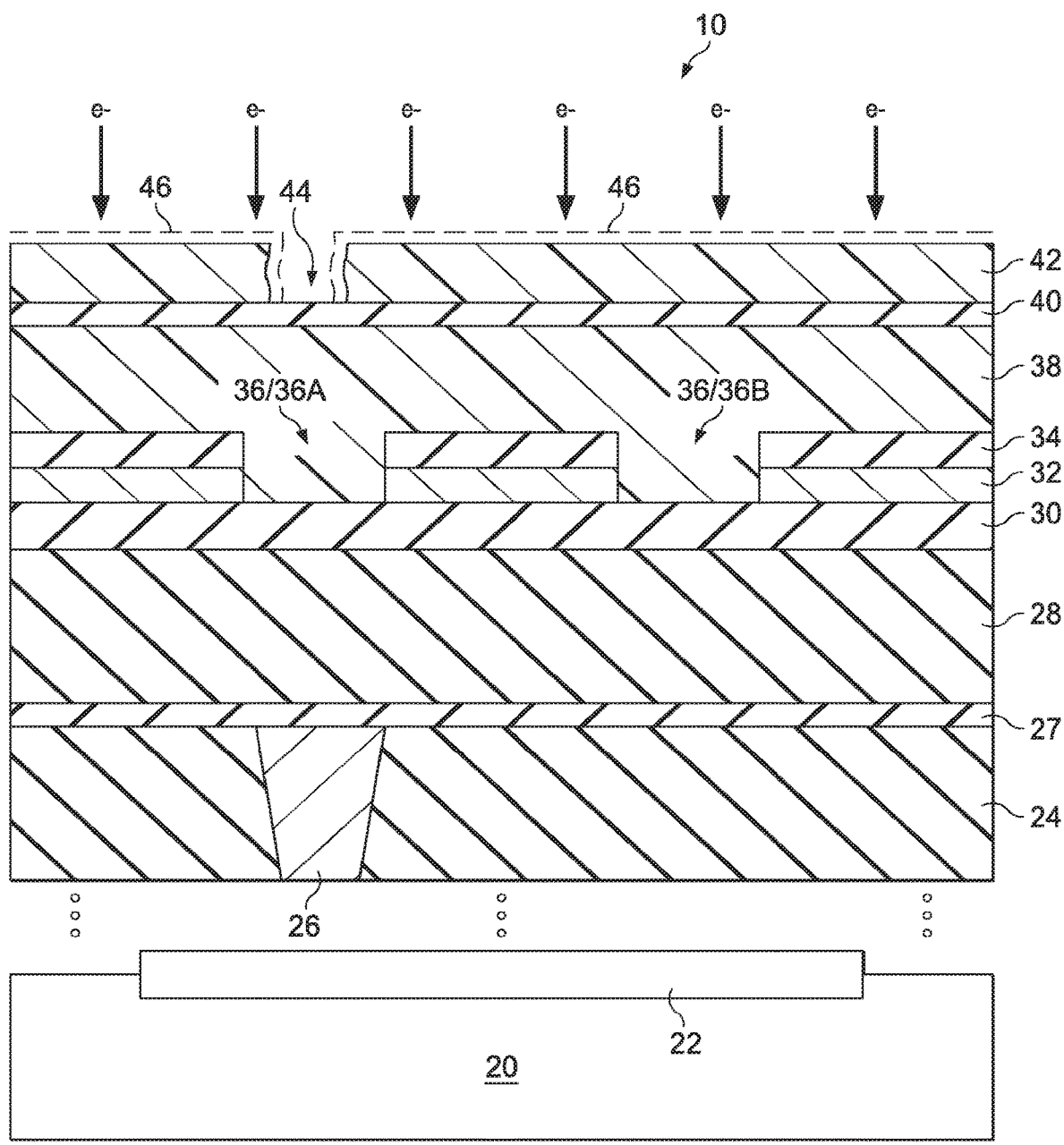
Figure 11:
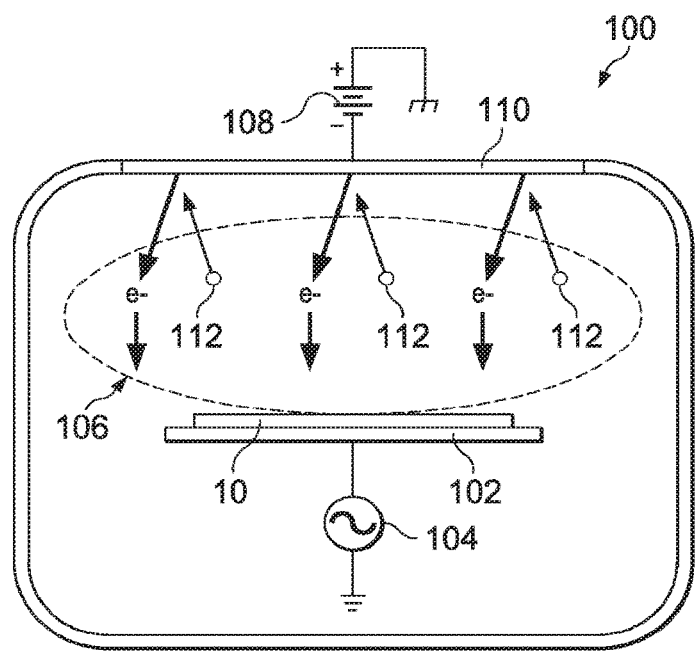
FIG. 11 illustrates an apparatus for treating the photo resist of a tri-layer etching mask in accordance with some embodiments.

FIG. 4 illustrates a treatment of photo resist 42. In accordance with some embodiments, the treatment includes an electron beam treatment, wherein electrons (e-) are accelerated as a ballistic electron beam that bombards photo resist 42. The production tool 100 that is used to perform the treatment of photo resist 42 is shown in FIG. 11. Wafer 10 is schematically illustrated in FIG. 11, while the details of wafer 10 are not illustrated in FIG. 11, and can be found in FIG. 4.

As shown in FIG. 11, production tool 100 is used to perform the treatment. Production tool 100 may be an etcher in accordance with some exemplary embodiments. The production tool 100 is configured to be vacuumed. Wafer 10 is placed on E-Chuck 102, which is configured to suck wafer 10 thereon through electrical-static force. Radio-Frequency (RF) power source 104 is connected to E-Chuck 102 to generate plasma 106 over wafer 10. The plasma 106 may be generated from the process gases that are introduced into production tool 100. The process gases may include argon, helium, hydrogen ($H_2$), and/or the like. A DC power source 108 is further connected to upper electrode 110, wherein plasma 106 is generated in the gap between upper electrode 110 and wafer 10. The negative end of DC power source 108 is connected to upper electrode 110, so that upper electrode 110 is applied with a negative voltage.

During the treatment, the ions 112 in plasma 106, which ions 112 may be Ar+ ions, for example, are accelerated by the electrical field generated by the negative voltage applied on upper electrode 110, so that ions 112 bombard upper electrode 110. As a result, secondary electrons e- are generated. Driven by the electrical field, secondary electrons e- are accelerated as a ballistic electron beam toward photo resist 42 (FIG. 4), which is at the surface of wafer 10. The electrons penetrate into photo resist 42, resulting in more cross-links to be generated in the photo resist 42. The portions of photo resist 42 with the electrons penetrating into are referred to as treated portions. Due to the increased cross-linking, the treated portions of photo resist 42 are more resistance to the subsequent etching of middle layer 40 (FIG. 4) than un-treated portions, and more photo resist 42 can be preserved after the etching of middle layer 40 is finished. The treatment may last for a period of time shorter than about 10 seconds.

As schematically illustrated in FIG. 4, which shows upper portions and lower portions of photo resist 42 differently, the cross-linking of upper portions of photo resist 42 may improved more by the treatment of photo resist 42, while deeper into photo resist 42, the cross-linking of photo resist 42 may be improved less and less. To increase the thickness of the treated portions of photo resist 42, the kinetic energy of the electrons e- (FIG. 11) is increased, for example, by increasing the magnitude of the negative DC voltage applied on upper electrode 110. In some exemplary embodiments, the magnitude of the negative DC voltage applied on upper electrode 110 is greater than 500 volts. With the magnitude of the negative DC voltage being 500 volts or higher, the remaining photo resist 42 that is left after the etching step in FIG. 5 may have a thickness greater than the margin thickness (about 250 Å) that is required for the reliable etching-through of middle layer 40. For example, the negative DC voltage may be between about −500 volts and about −900 volts.

The power of the RF power source 104 (FIG. 11) affects the efficiency of the treatment and the quality of the resulting photo resist 42. If the power is too low, too few ions 112 are generated in plasma 106, and in turn, too few secondary electrons e- are generated. The treatment is thus not effective. If the power is too high, since photo resist 42 is consumed by the electrons at the same time photo resist 42 is improved, the consumption rate is too high, and the resulting photo resist 42 may be too thin after the treatment. The optimum range of the power of the RF power source 104 is thus in a window. Experiment results indicated that when the power of RF power source 104 is between about 50 watts and about 150 watts, the efficiency of the treatment is high enough, and the consumption of photo resist 42 is acceptable. It is noted, however, that the optimum range of RF power source 104 may be affected by various factors such as the type of photo resist 42 and the flow rates of the process gases, and may be in different ranges in different scenario.

The treatment may cause the shrinking of photo resist 42. As a result, the width of opening 44 (FIG. 4) may be adversely increased. To counter this effect, hydrogen ($H_2$)

may be added in the process gases that are used in production tool 100 (FIG. 11). The hydrogen has the effect of forming bonds with photo resist 42 to form hydro-carbonare, so that the shrinking of photo resist 42 is reduced. An exemplary flow rate of hydrogen is between about 100 sccm and about 250 sccm. In some embodiments, during the treatment, hydrogen and argon are introduced into production tool 100 (FIG. 11), with the flow rate of argon denoted as FRA, and the flow rate of hydrogen denoted as FRH. Experiment results indicate that when the flow rate ratio FRH/FRA is between 1/8 and 1/4, the shrinkage of photo resist 42 is minimized. In alternative embodiments, the flow rate ratio FRH/FRA is lower than 1:8. In yet alternative embodiments, the process gases introduced into production tool 100 (FIG. 11) during the treatment are free from hydrogen, or substantially free from hydrogen.

During the treatment, no etching gas that can etch middle layer 40 (FIG. 4) is introduced. The process gases that are introduced into production tool 100 (FIG. 11) during the treatment may be free from, or substantially free from, fluorine-containing gases such as $CF_4$ and chlorine-containing gases such as $Cl_2$. Accordingly, during the treatment, middle layer 40 is not etched. In addition, during the treatment, the process gases may be free from, or substantially free from, any carbon-containing gas. Furthermore, during the treatment, the process gas may not include any nitrogen ($N_2$) and/or any oxygen ($O_2$). In alternative embodiments, nitrogen and/or oxygen may be added into the process gases during the treatment. Throughout the description, when production tool 100 (FIG. 11) is referred to as "substantially free from" a process gas, the flow rate of the process gas is smaller than about 3 sccm.

The treatment has the effect of de-scuming, so that the residue 45 of photo resist 42 (FIG. 3) is removed after the treatment of photo resist 42. In accordance with the embodiments of the present disclosure, no de-scum step is performed.

Referring again to FIG. 4, after the treatment, photo resist 42 may shrink, wherein dashed lines 46 represent the surfaces of photo resist 42 before the shrinkage. It is observed that the size of opening 44 is increased due to the treatment.

Figure 5:
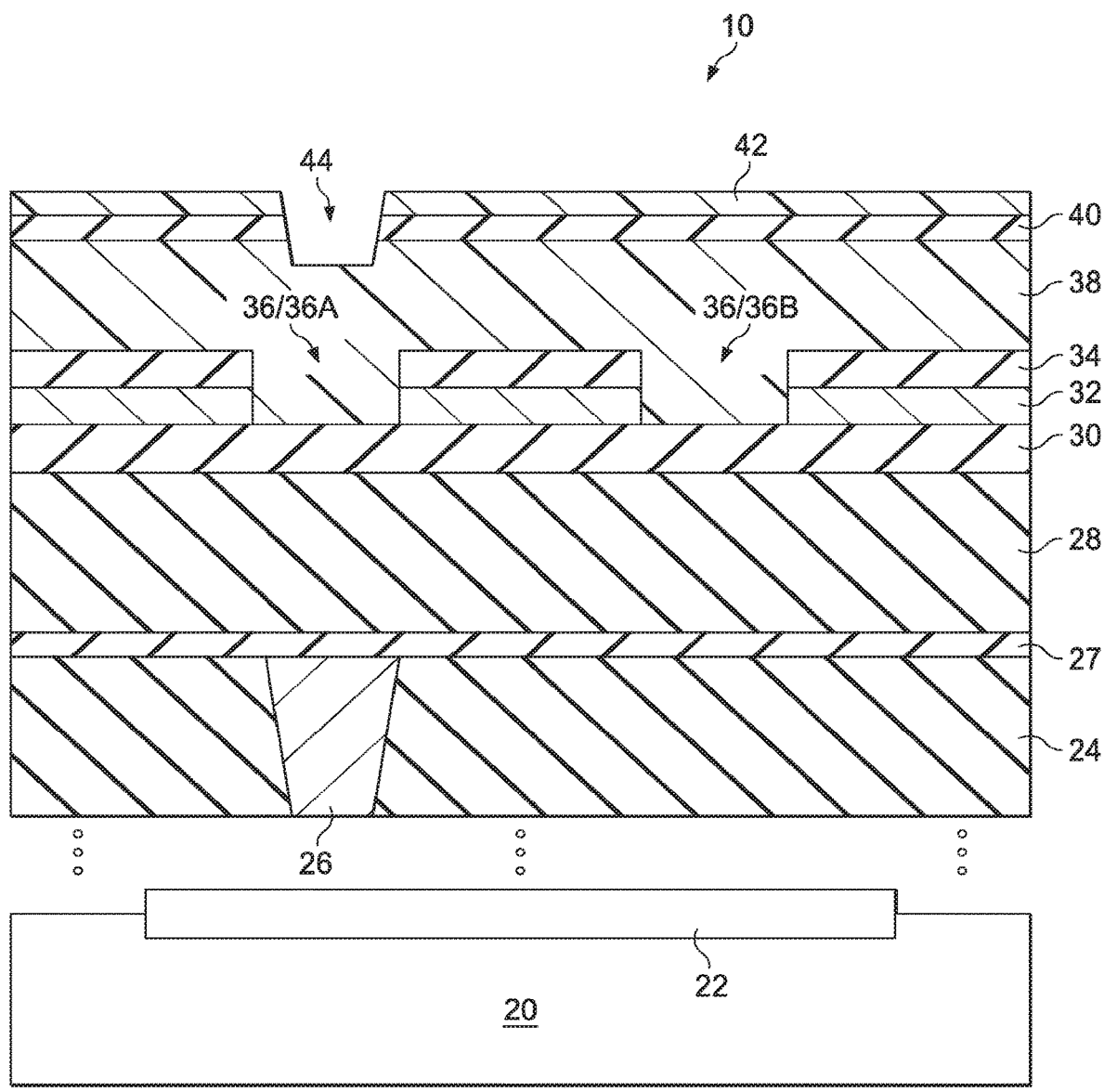

Next, referring to FIG. 5, the treated photo resist 42 is used as an etching mask to etch middle layer 40, so that opening 44 extends through middle layer 40. During the etching, fluorine-containing gases such as $CF_4$ and chlorine-containing gases such as $Cl_2$ may be used as the etchant gas. In the treatment of photo resist 42, the treated portions of photo resist 42 is more resistant to the etchant (such as $CF_4$) used in the etching of middle layer 40. Therefore, although the thickness of photo resist 42 is reduced in the treatment, the etching rate of the treated portions of photo resist 42 is significantly reduced. Overall, after the middle layer 40 is etched through, photo resist 42 still has a remaining layer, which has a thickness greater than about 250 Å, for example. The thickness of the remaining layer of photo resist 42 in accordance with the embodiments of the present disclosure is greater than the thickness of the remaining layer of photo resist 42 when treatment is performed on photo resist 42.

Figure 6:
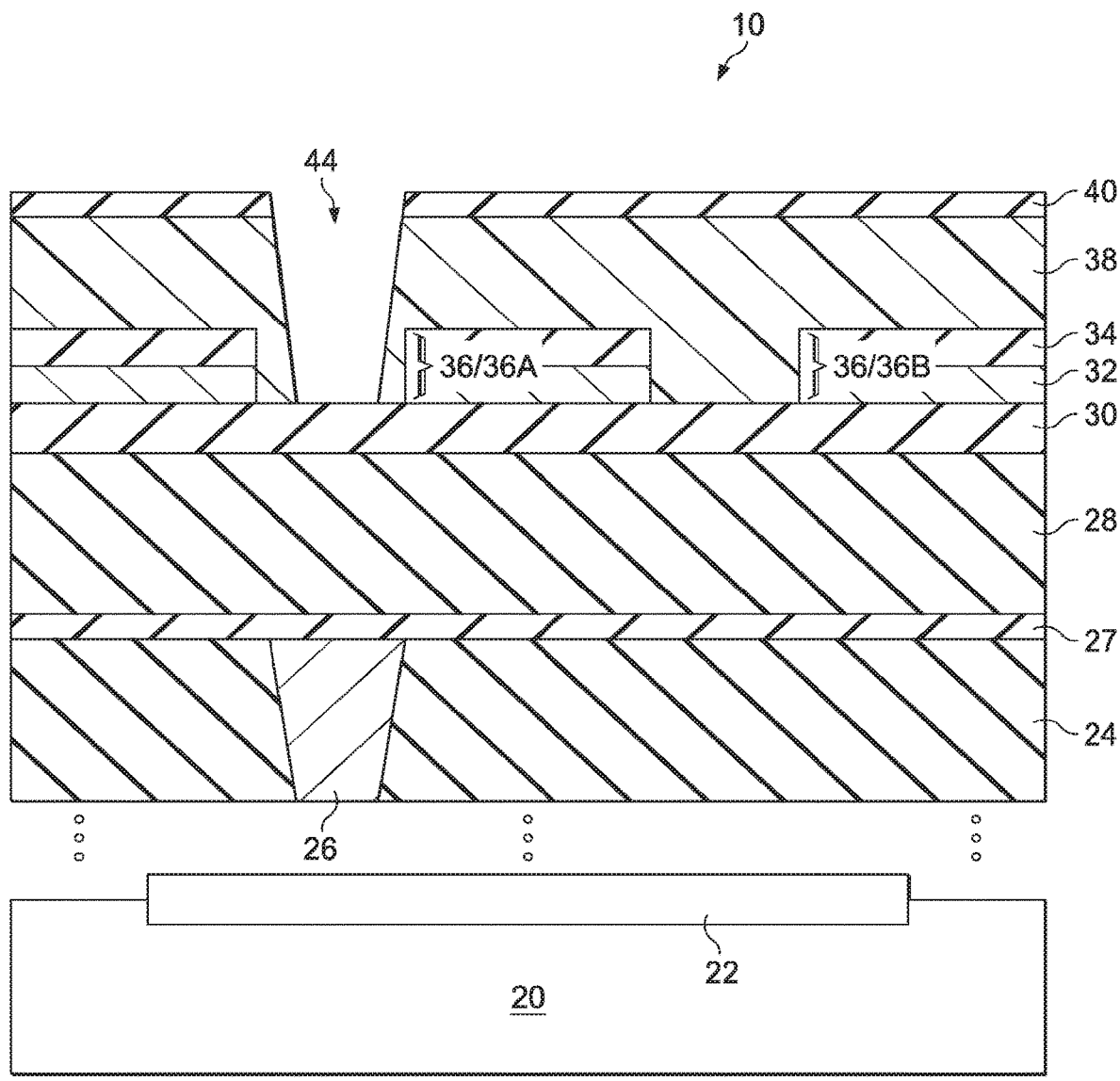

FIG. 6 illustrates the etching of bottom layer 38 using the patterned middle layer 40 as an etching mask. Opening 44 thus extends down to the bottom of bottom layer 38. Opening 44 is aligned to trench 36A. Accordingly, dielectric hard mask 30 is exposed through opening 44.

Figure 7:
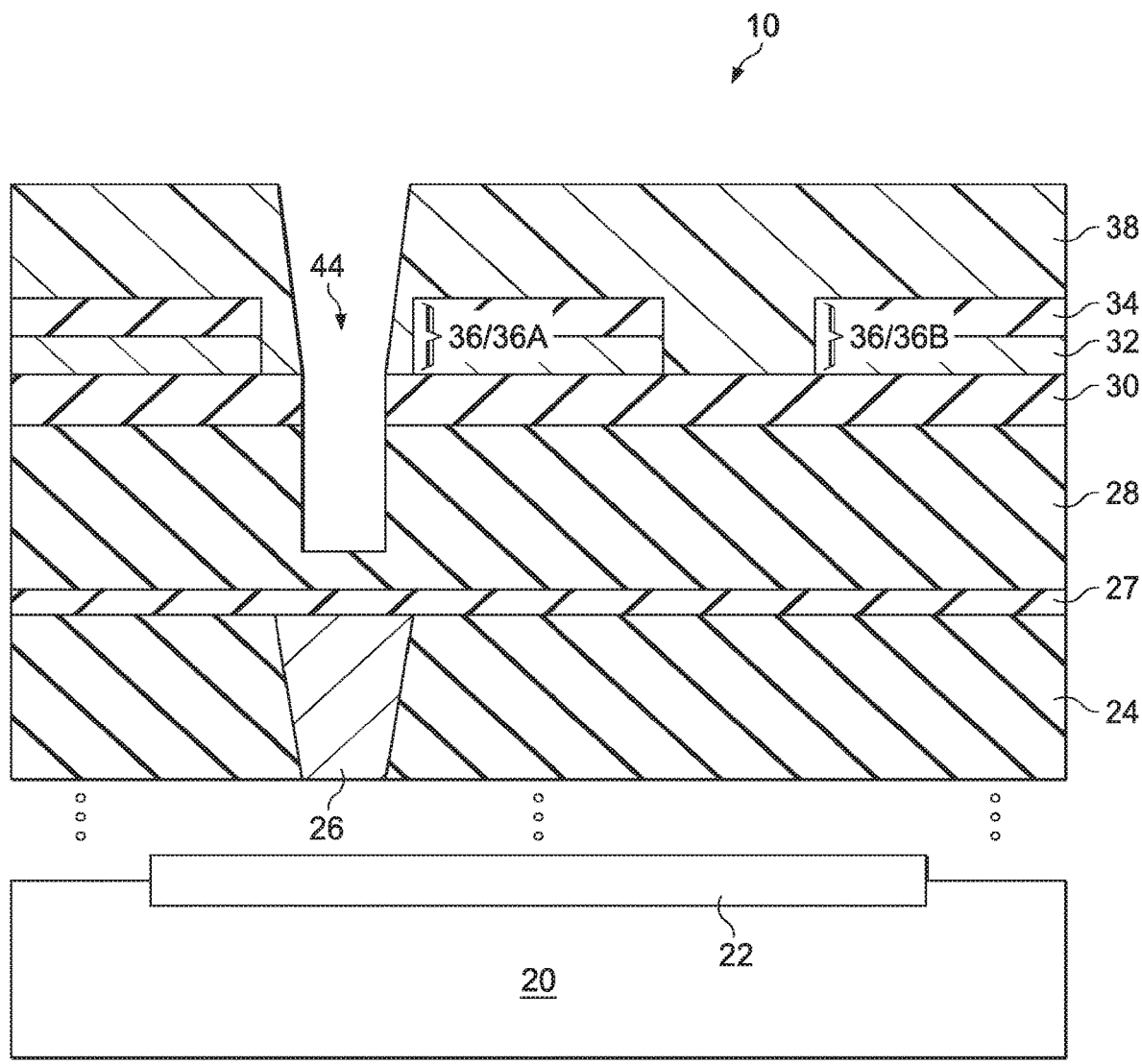

In a subsequent step, dielectric hard mask 30 is etched through by using bottom layer 38 as an etching mask, followed by etching low-k dielectric layer 28. Middle layer 40 is removed in the etching of low-k dielectric layer if it has not been fully consumed in the etching of bottom layer 38. Opening 44 thus extends down into low-k dielectric layer 28. The resulting structure is shown in FIG. 7. The etching of low-k dielectric layer 28 stops when the bottom of opening 44 reaches an intermediate level between the top surface and the bottom surface of low-k dielectric layer 28.

Figure 8:
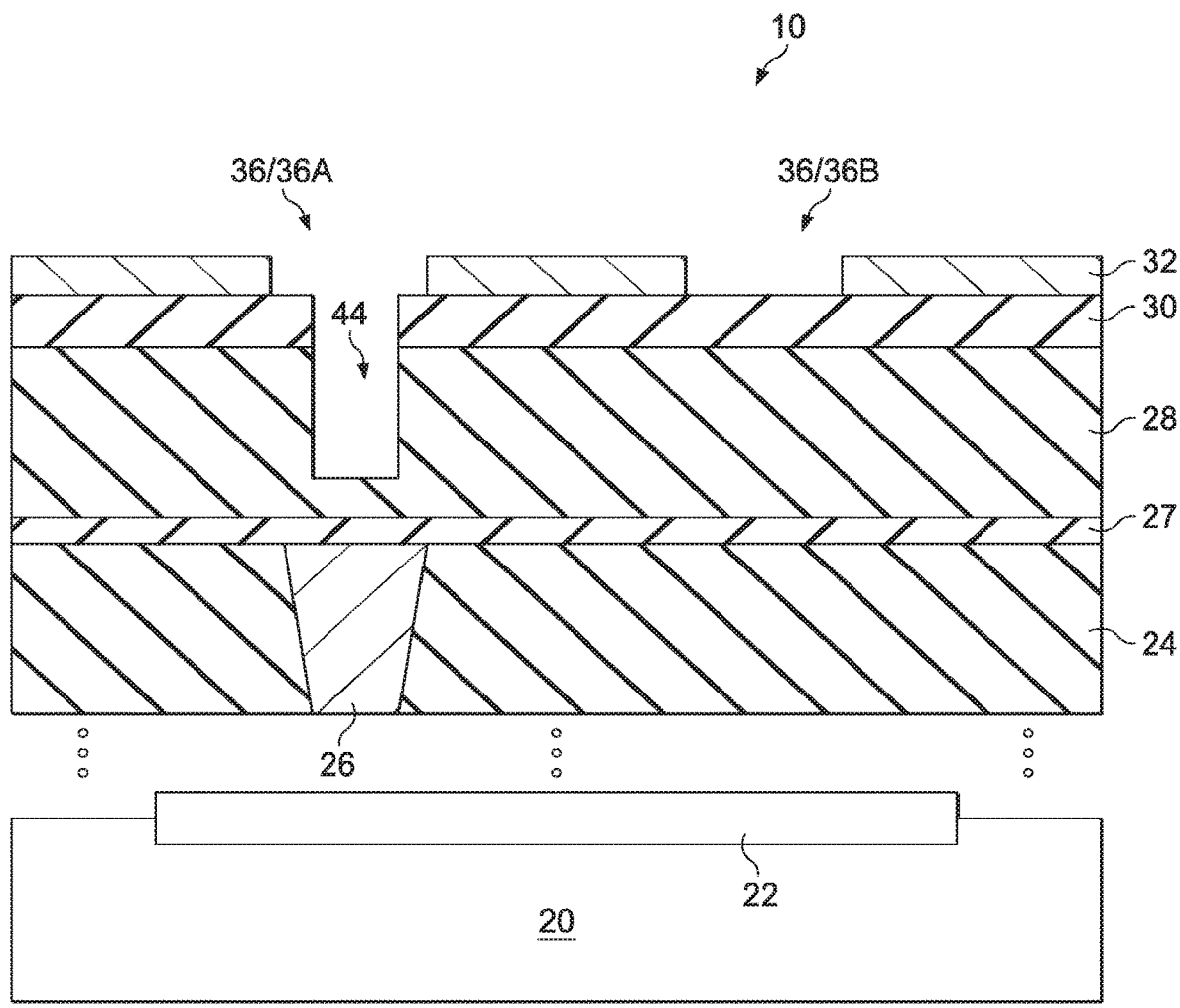
Figure 9:
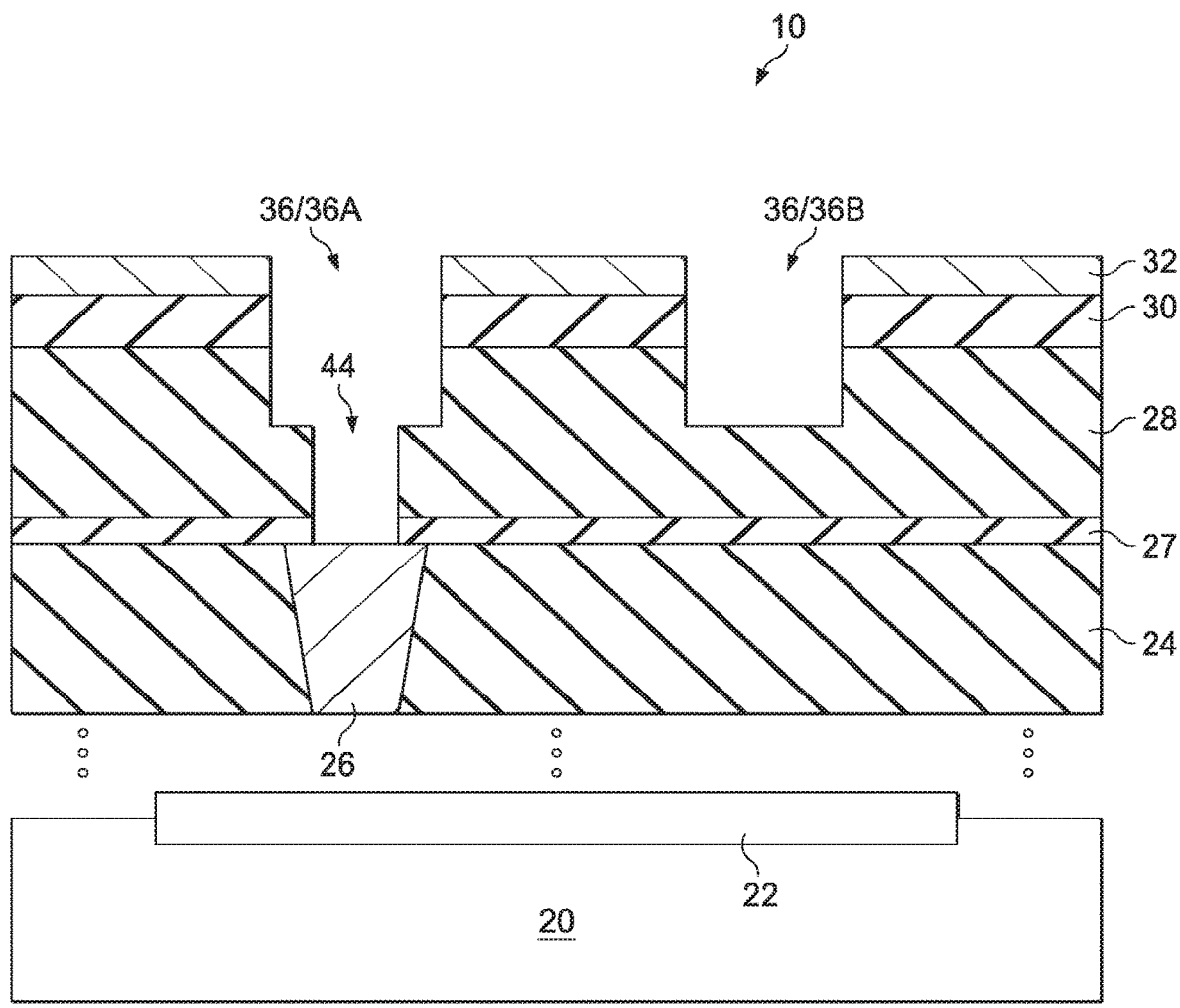

Bottom layer 38 and dielectric hard mask layer 34 may be consumed in this process, or etched separately if they are not fully consumed. The resulting structure is shown in FIG. 8. In FIG. 9, the patterned hard mask 32 is used as an etching mask to etch the underlying and low-k dielectric layer 28, so that trenches 36A and 36B extend down into low-k dielectric layer 28. At the same time, opening 44 extends down to the bottom of low-k dielectric layer 28 to form a via opening (also referred to as via opening 44). An additional process step is also performed to etch-through etch stop layer 27, so that metal feature 26 is exposed to via opening 44.

Figure 10:
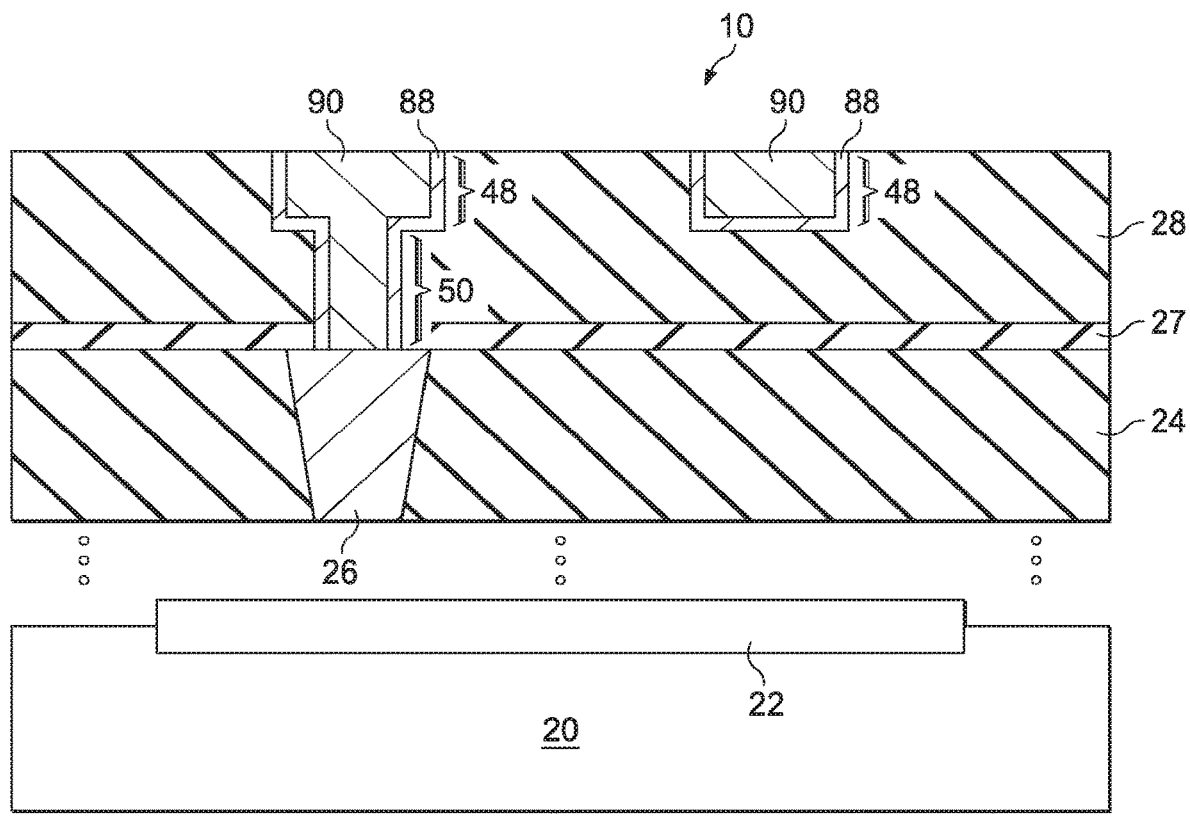

FIG. 10 illustrates the filling of trenches 36 and via opening 44 (FIG. 9) to form metal lines 48 and via 50, respectively. The formation may include a dual damascene process, wherein a conductive barrier layer 88 such as titanium nitride, titanium, tantalum nitride, tantalum, or the like is formed on the sidewalls and the bottoms of trenches 36 and via opening 44. The remaining portions of trenches 36 and via openings 44 are then filled with a filling metal 90 such as copper or copper alloy. A Chemical Mechanical Polish (CMP) is then performed to remove excess portions of the barrier layer 88 and the filling metal 90, forming metal lines 48 and via 50 as shown in FIG. 10. Metal line 48 and via 50 are electrically connected to the underlying conductive feature 26.

The embodiments of the present disclosure have some advantageous features. By treating the photo resist in the tri-layer etching mask, the photo resist in the tri-layer etching mask has more left after its underlying middle layer is etched. The photo resist may be a negative photo resist. Accordingly, in accordance with the embodiments of the present disclosure, the electron beam may improve the cross-linking of the negative photo resist. The adjustment of the DC voltage can adjust the velocity of the electrons, and hence the thickness of the treated portion of the photo resist is adjusted to an optimum value. As a result of the treatment, the margin of the etching process is improved. As a comparison, in conventional processes, since no treatment is performed, the thickness of the remaining photo resist does not have enough margin. Hence, the photo resist is likely to be completely consumed before the middle layer is etched through, and hence the middle layer is blanket etched.

In accordance with some embodiments, a method includes exposing and developing a negative photo resist, and performing a treatment on the negative photo resist using an electron beam. After the treatment, a layer underlying the negative photo resist is etched using the negative photo resist as an etching mask.

In accordance with other embodiments, a method includes forming a hard mask over a low-k dielectric layer, wherein the hard mask comprises a trench therein, and forming a tri-layer etching mask. The formation of the tri-layer etching mask includes forming a bottom layer over the hard mask, forming a middle layer over the bottom layer, and forming a photo resist over the middle layer. The method further includes light-exposing and developing the photo resist, generating an electron beam in a production tool, treating the photo resist in the production tool using the electron beam, etching the middle layer using the photo resist as a first etching mask, and etching the bottom layer using the middle layer as a second etching mask. The low-k dielectric layer is etched using the second etching mask to form a via opening in the low-k dielectric layer. The low-k dielectric layer is then further etched using the hard mask as an etching mask, wherein the trench in the hard mask extends into the low-k dielectric layer, and the via opening simultaneously extends down to a bottom of the low-k dielectric layer. The via opening and the trench in the low-k dielectric layer are filled to form a via and a metal line, respectively.

In accordance with yet other embodiments, a method includes placing a wafer in a production tool, wherein the wafer includes a patterned negative photo resist at a surface of the wafer, with the patterned negative photo resist having an opening. The wafer faces an electrode. The method further includes introducing a process gas into the production tool, using an RF power source to generate a plasma from the process gas, and applying a negative DC voltage to the electrode to generate an electron beam, with the electron beam received by the patterned negative photo resist to treat the patterned negative photo resist. After the patterned negative photo resist is treated by the electron beam, a middle layer underlying the patterned negative photo resist is etched, and a bottom layer underlying the middle layer is etched. A low-k dielectric layer underlying the bottom layer is then etched, wherein a pattern of the opening in the patterned negative photo resist is transferred into the low-k dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a wafer comprising:
      forming a hard mask over a low-k dielectric layer, wherein the hard mask comprises a trench therein;
      forming a bottom layer over the hard mask, wherein the bottom layer is a photo-resist containing layer, and the bottom layer is filled into the trench;
      forming a middle layer over the bottom layer; and
      forming a patterned photo resist over the middle layer, wherein the patterned photo resist has an opening;
   after the patterned photo resist is formed over the middle layer, performing a treatment on the patterned photo resist to increase cross-linking in the patterned photo resist, wherein the treatment comprises using a process gas, wherein the process gas is free of an etchant gas suitable for etching the middle layer;
   after performing the treatment, etching the middle layer using an etching gas and the patterned photo resist as an etching mask;
   etching the bottom layer; and
   etching the low-k dielectric layer, wherein a pattern of the opening in the patterned photo resist is transferred into the low-k dielectric layer.

2. The method of claim 1, wherein the treatment comprises generating secondary electrons, wherein the treatment comprises bombarding the patterned photo resist with the secondary electrons.

3. The method of claim 2, wherein generating the secondary electrons comprising:
   using a Radio-Frequency (RF) power source to generate plasma from the process gas; and
   applying a negative DC voltage on an electrode under the wafer to generate the secondary electrons.

4. The method of claim 1, wherein the treatment is performed in an etcher.

5. The method of claim 1, wherein at a time after the treatment is performed and before the middle layer is etched, the patterned photo resist has a thickness greater than about 250 Å.

6. The method of claim 1, wherein the patterned photo resist comprises a negative photo resist.

7. The method of claim 1, wherein during the treatment, the process gas is free of hydrogen gas.

8. The method of claim 1, wherein during the treatment, the process gas is free of fluorine-containing gas.

9. The method of claim 1, wherein the treatment has a duration shorter than about 10 seconds.

10. A method comprising:
   forming a hard mask;
   forming a bottom layer over the hard mask, wherein the bottom layer comprises a photo resist material;
   forming a middle layer over the bottom layer;
   forming a photo resist over and contacting the middle layer;
   forming an opening in the photo resist;
   generating secondary electrons;
   performing a treatment on the photo resist using the secondary electrons to form a treated photo resist, the treated photo resist comprising hydrocarbonate; and
   after the treatment, etching the middle layer using the treated photo resist as an etching mask.

11. The method of claim 10 further comprising transferring a pattern of the photo resist into a low-k dielectric layer underlying the hard mask to form a via opening.

12. The method of claim ii further comprising:
   forming a trench pattern in the hard mask; and
   transferring the trench pattern into the low-k dielectric layer to form a trench, wherein the pattern of the photo resist is transferred into the via opening in the low-k dielectric layer, with the via opening underlying the trench.

13. The method of claim 10, wherein the photo resist is a negative photo resist.

14. The method of claim 10, wherein the treatment is performed using a process gas comprising hydrogen.

15. The method of claim 14, wherein the process gas further comprises argon, and during the treatment, a ratio of a first flow rate of the hydrogen to a second flow rate of the argon is between $1/8$ and $1/4$.

16. A method comprising:
   forming a wafer comprising:
      a hard mask over a low-k dielectric layer;

a bottom layer over the hard mask, wherein the bottom layer comprises a photo resist;
a middle layer over the bottom layer; and
a patterned photo resist over the middle layer, the patterned photo resist having an opening;
after forming the wafer having the patterned photo resist, treating the patterned photo resist using a process gas mixture comprising a hydrogen ($H_2$) gas and an argon gas, wherein treating the patterned photoresist converts at least a portion of the patterned photo resist to hydrocarbonate;
after the patterned photo resist is treated, etching the middle layer using the patterned photo resist as a first etching mask; and
patterning the bottom layer and the low-k dielectric layer using the etched middle layer as a second etching mask.

17. The method of claim 16, wherein the treating results in the patterned photo resist to have increased cross-linking.

18. The method of claim 16, wherein the treating results in the patterned photo resist to have a reduced etching rate when the middle layer is etched.

19. The method of claim 16 further comprising filling a conductive material into the patterned low-k dielectric layer.

20. The method of claim 16, wherein the patterned photo resist is treated using secondary electrons generated from the hydrogen gas and the argon gas.

\* \* \* \* \*

UNITED STATES PATENT AND TRADEMARK OFFICE
CERTIFICATE OF CORRECTION

PATENT NO. : 11,018,021 B2  
APPLICATION NO. : 16/505193  
DATED : May 25, 2021  
INVENTOR(S) : Wen-Kuo Hsieh Page 1 of 1

It is certified that error appears in the above-identified patent and that said Letters Patent is hereby corrected as shown below:

In the Claims

In Claim 12, Column 8; Line 50 delete "ii" insert --11--

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*